(12) United States Patent
Hosokawa

(10) Patent No.: US 6,252,810 B1
(45) Date of Patent: Jun. 26, 2001

(54) CIRCUIT AND METHOD FOR DETECTING DEFECTS IN SEMICONDUCTOR MEMORY

(75) Inventor: Kohji Hosokawa, Ohtsu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/636,477

(22) Filed: Aug. 10, 2000

(30) Foreign Application Priority Data

Aug. 12, 1999 (JP) .................................................. 11-228385

(51) Int. Cl.$^7$ ...................................................... G11C 8/18
(52) U.S. Cl. ................. 365/200; 365/225.7; 365/230.08; 365/189.07; 365/203; 365/193
(58) Field of Search ................. 365/200, 225.7, 365/230.08, 189.07, 203, 193, 191

(56) References Cited

U.S. PATENT DOCUMENTS 4,718,041 * 1/1988 Baglee et al. ................... 365/185.22

FOREIGN PATENT DOCUMENTS 62-188100 * 8/1987 (JP) .............................. G11C/17/00

* cited by examiner

Primary Examiner—Andrew Q. Tran
(74) Attorney, Agent, or Firm—Robert A. Walsh

(57) ABSTRACT

A defect detecting circuit of the present invention accelerates comparison and judgment by making an address-information renewing and holding circuit 2' previously hold outputs (program information) of a program-information holding circuit 1' at the end of the last operation as address information before renewing and holding addresses in the address-information renewing and holding circuit 2' and thereby simplifying a configuration of a compare and detection Circuit 3'.

5 Claims, 4 Drawing Sheets

CIRCUIT AND METHOD FOR DETECTING DEFECTS IN SEMICONDUCTOR MEMORY

FIELD OF THE INVENTION

The present invention generally relates to a circuit and a method for detecting defects in a semiconductor memory, particularly to a circuit and a method for replacing a defective cell or a line in a semiconductor memory having spare row lines and column lines (bit lines and word lines) with a spare line (cell).

BACKGROUND OF THE INVENTION

Many semiconductor-memory products such as DRAMs use the so-called defect relieving method for improving the yield of memory products by using spare row lines and column lines (bit lines and word lines) and replacing these space row lines or column lines with row lines or column lines in which a defect occurs. A defect detection circuit is a circuit for comparing an accessed address with an address previously assigned to a spare row line and column line and determining whether to replace the former address with the latter address.

FIG. 1 is an illustration showing a conventional defect detection circuit. Circuit 1 is a circuit for holding an address determined to be a defect when testing a memory product as previously-programmed information (hereafter referred to as program information) by using a fuse or the like. Circuit 2 is a circuit for renewing and holding an address accessed (inputted) in read or write operation as address information. Though the number of pieces of address information to be inputted depends on a configuration of a memory, 10 to 14 pieces of the address information are required. Circuit 3 is a circuit for comparing program information outputted from Circuit 1 with address information outputted from Circuit 2 and determining whether to select a spare line.

FIG. 2 is an illustration showing a configuration of the comparing and detection Circuit 3 in FIG. 1. In FIG. 2, the program information ($i^{th}$) outputted from the Circuit 1 is compared with the address information ($i^{th}$) outputted from the Circuit 2 by an exclusive NOR Circuit 4. Then, comparison results are accumulated by a combinational Circuit 5 comprising a NAND circuit and a NOR circuit and when all the comparison results are matched, a result of replacement with spare lines is outputted.

The compare and detection Circuit 3 in FIG. 2 usually optimizes a combinational circuit comprising logical gates and the size of a transistor to be used. However, because of a large number of inputs such as 10 to 14, the combinational Circuit 5 requires logical gates of at least three stages as shown in FIG. 2. As a result, a problem occurs that it takes a lot of time to output a comparison and selection result.

SUMMARY OF THE INVENTION

It is an object of the present invention to provide a circuit and a method for detection of defects in a semiconductor memory operating at a high speed.

Another object of the present invention is to provide a circuit and a method for detection of defects in a semiconductor memory operating at a high speed without greatly increasing a circuit area.

The present invention provides a circuit for detecting defects in a semiconductor memory having spare row lines and column lines, comprising:

a program-information holding circuit for holding program information showing addresses previously assigned to spare row lines or column lines;

an address-information refreshing and holding circuit for refreshing and holding address information in row lines and column lines to be accessed in read or write operation; and a compare and detection circuit for comparing program information outputted from the program-information holding circuit with address information outputted from the address-information refreshing and holding circuit and determining whether to replace a row line or column line to be accessed with a spare row line or column line; wherein the address-information refreshing and holding circuit has a function of previously holding the program information outputted from the program-information holding circuit at the end of the last operation as address information.

The present invention provides a method for detection of defects in a semiconductor memory having spare row lines and column lines, comprising the steps of:

holding program information showing addresses previously assigned to spare row lines and column lines;

holding address information in row lines and column lines to be accessed in read or write operation inputted from an external unit; and comparing the held program information with the held address information and determining whether to replace a row line or column line to be accessed with a spare row line or column line; wherein the address-information holding step includes the step of previously holding the program information held at the end of the last operation as address information.

DESCRIPTION OF THE PREFERRED EMBODIMENT

Figure 1:
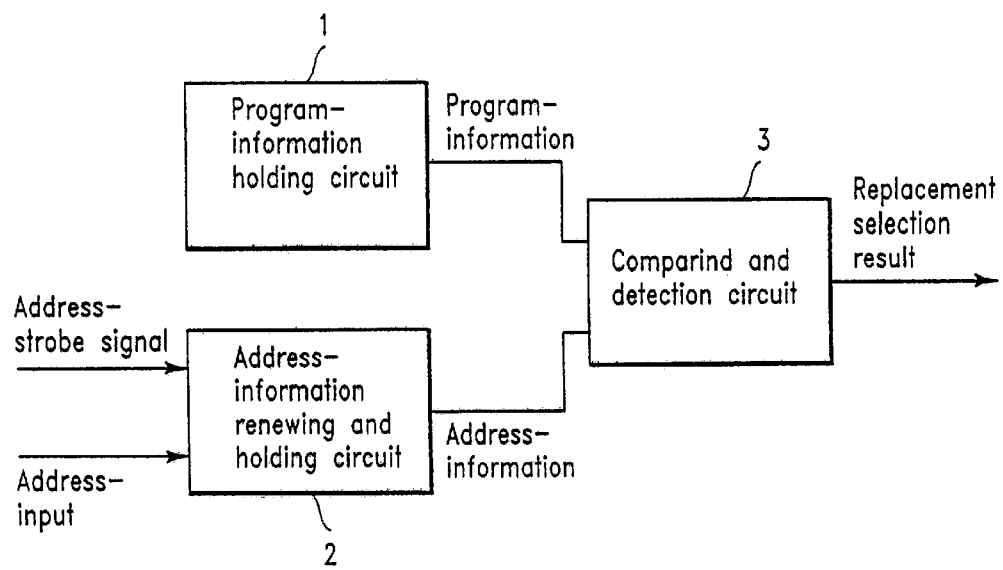
FIG. 1 is an illustration showing a conventional defect relief detection circuit.
Figure 2:
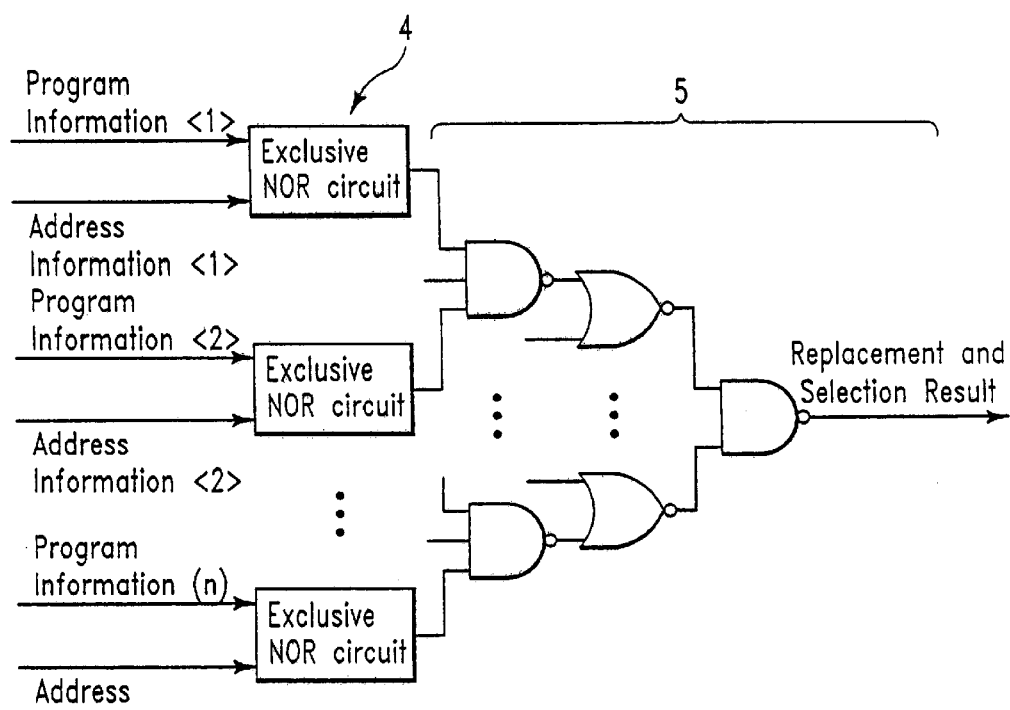
FIG. 2 is an illustration showing a configuration of the conventional compare and detection Circuit 3 in FIG. 1.
Figure 3:
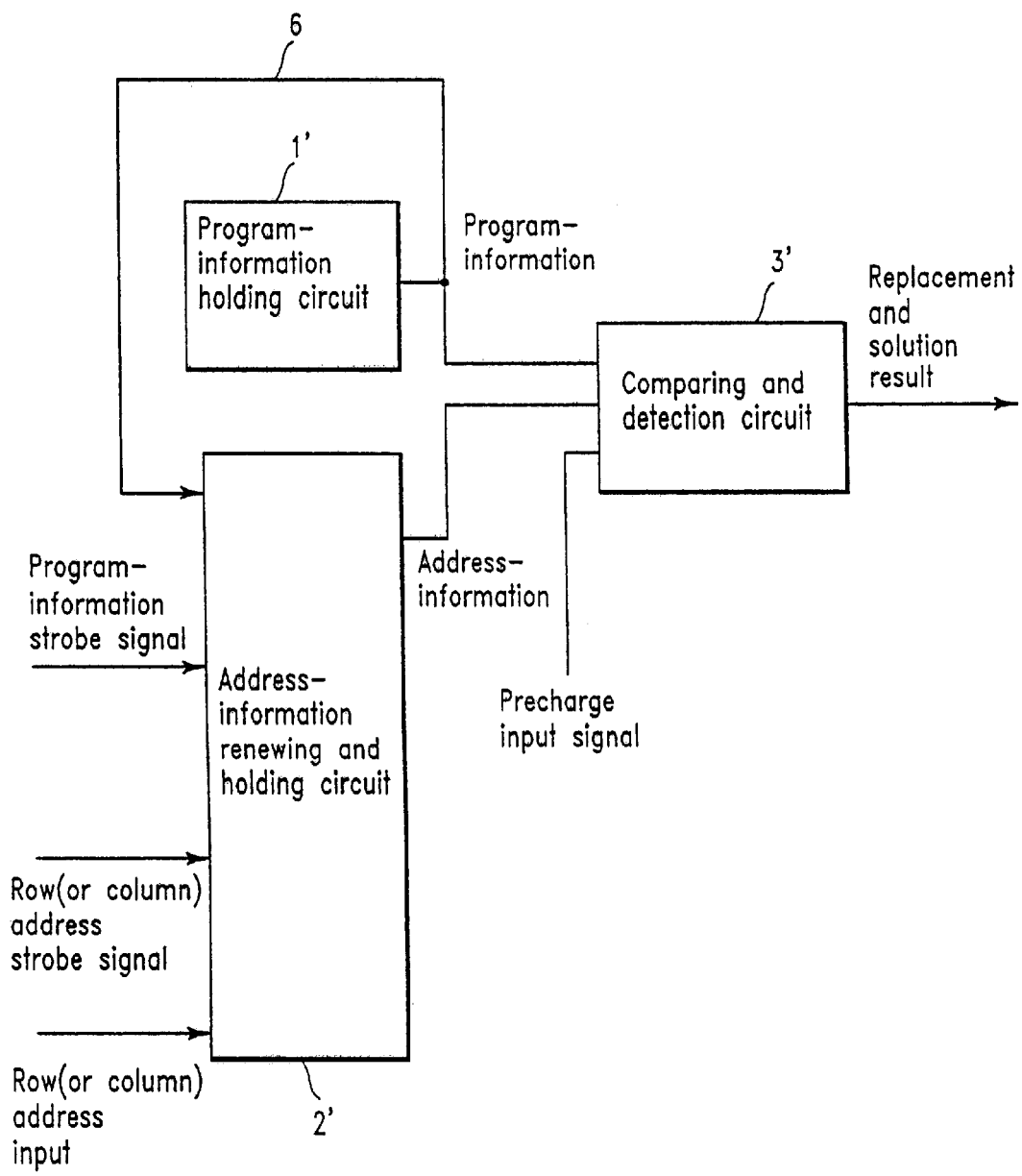
FIG. 3 is an illustration showing an embodiment of a circuit of the present invention for detecting defects in a semiconductor memory.

FIG. 3 is an illustration showing an embodiment of a circuit of the present invention for detection of defects in a semiconductor memory. The circuit shown in FIG. 3 is made-up of three circuits 1', 2', and 3'. The Circuit 1', is a program-information holding circuit for holding program information showing addresses previously assigned to spare row lines or column lines and serves the same function as the Circuit 1 in FIG. 1. The Circuit 2' is an address-information renewing and holding circuit for renewing and holding address information in row lines and column lines to be accessed in read or write operation. The address-information renewing and holding Circuit 2' has a function of previously holding program information outputted from a program-information holding circuit as address information at the end of the last operation, which function the conventional Circuit 2 in FIG. 2 does not have. An output 6 of the Circuit 1' is inputted to the Circuit 2' in order to meet the function. The Circuit 3' is a compare and detection circuit for comparing program information outputted from a program-information holding circuit with address information outputted from an address-information renewing and holding circuit and judging whether to replace a row line or column line to be accessed with a spare row line or column line.

A defect detection circuit of the present invention in FIG. 3, as discussed hereinafter, is characterized by accelerating defect detection by effectively using a precharge period necessary as a preparation period in a series of read/write operations of a semiconductor memory such as a DRAM. Moreover, a defect detection circuit of the present invention is characterized by making the address-information renewing and holding Circuit 2' previously hold outputs (program information) of the program-information holding Circuit 1' at the end of the last operation as address information before renewing and holding addresses in the address-information renewing and holding Circuit 2' and thereby, simplifying the configuration of the comparing and judging Circuit 3' and accelerating comparison and determination.

Figure 4:
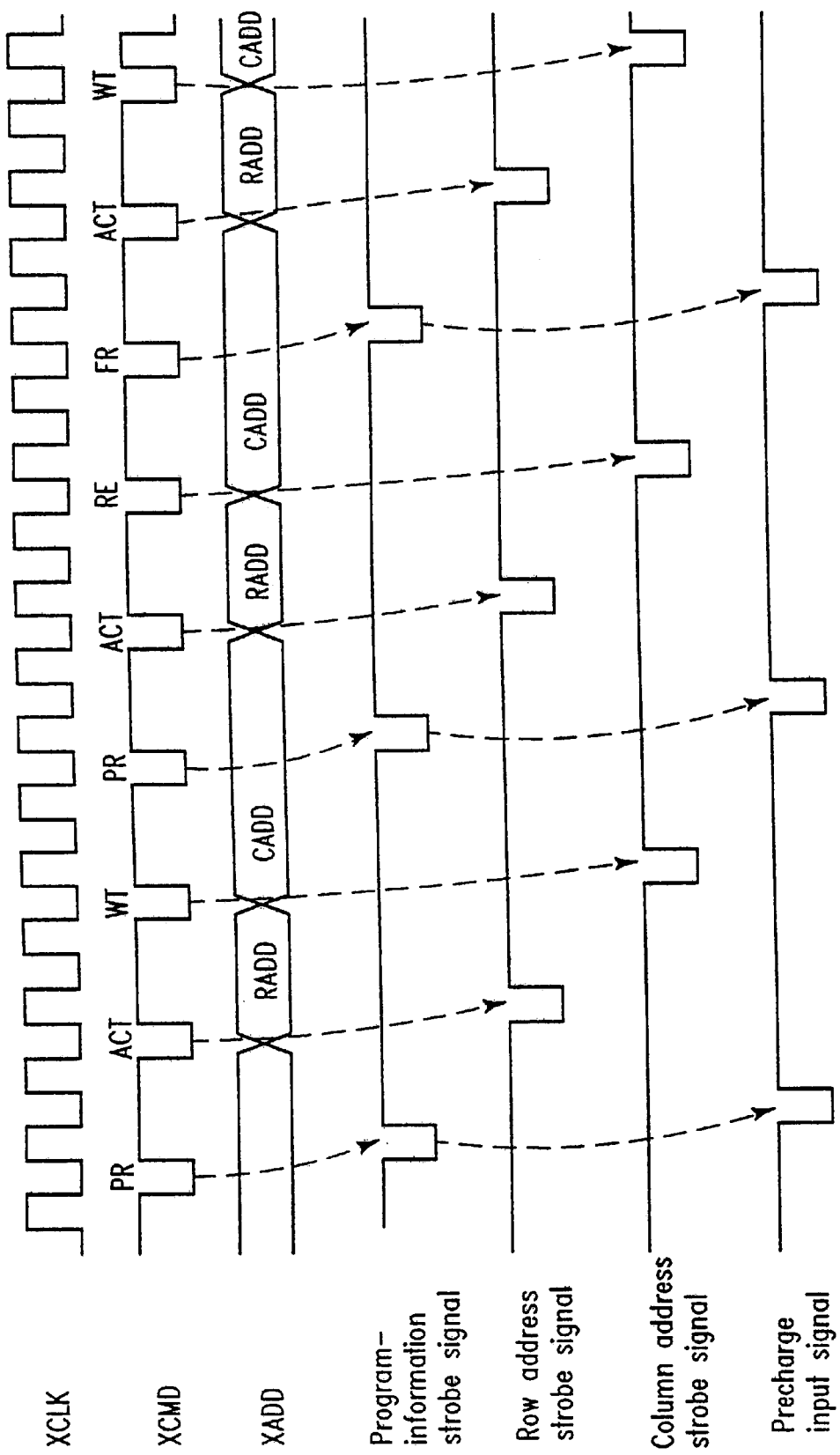
FIG. 4 is an illustration showing a timing chart of a semiconductor memory necessary for operations of a defect detection circuit of the present invention.

FIG. 4 is an illustration showing a timing chart of a semiconductor memory required for operations of a defect detection circuit of the present invention. FIG. 4 shows a timing system of SDRAM. In FIG. 4, XCLK, XCMD, and XADD denote an external input clock, an external input command, and an external input address in order. The external input command XCMD comprises a plurality of pins and PR (Precharge Command), ACT (Active Command), WT (Write Command), and RD (Read Command) are inputted together with addresses in accordance with combinations of pins. In the case of a memory product, it is usually determined in the specification to first input PR (Precharge Command) after inputting a power supply.

Then, the outline of operations of a defect detection circuit of the present invention in FIG. 3 will be described hereinafter. Program information showing addresses previously assigned to spare row lines or column lines is held by the Circuit 1'. First, a program-information strobe signal is generated in a chip in accordance with external PR (Precharge Command). The program information in the Circuit 1' is inputted to the Circuit 2' in accordance with the strobe signal to update the address information in the Circuit 2' and held as address information. At the same time, the program information in the Circuit 1' serves as an output of the address information in the Circuit 2' and is inputted to the Circuit 3'. Moreover, as shown in FIG. 4, a precharge input signal is generated from the program-information strobe signal. The precharge input signal is inputted to the Circuit 3' to precharge an output of the Circuit 3'.

When ACT (Active Command) is inputted from an external unit, a row-address strobe signal is generated in a chip. At the same time, a row address inputted from an external unit is captured and held by the Circuit 2'. The held row address is inputted to the Circuit 3' as new address information. Address information and program information are compared and judged by the Circuit 3'. Depending on the result, a normal word (column) line or a spare word (column) line is selected.

Moreover, when ACT (Active Command) is inputted and thereafter, WT (Write Command) or RD (Read Command) is inputted, a column-address strobe signal is generated in a chip and defect detection for column address is performed similarly to the case of the defect detection for row address. Depending on the result, a normal column line or a spare column line is selected. A program-information strobe signal and a precharge input signal can be used for both row address and column address. When a memory product to be applied has a page mode, a plurality of WTs (Write Commands) or RDs (Read Commands) may be inputted before PR (Precharge Command). Therefore, a defect detection circuit of the present invention cannot be applied to a defect detection circuit for column address. However, because precharge operation is necessary for a row address every cycle, a defect detection circuit of the present invention can be applied to every product.

Then, more specific configurations of the address-information renewing and holding Circuit 2' and comparing and detecting Circuit 3' of the present invention are shown and operations of a defect detection circuit of the present invention are described below in detail.

Figure 5:
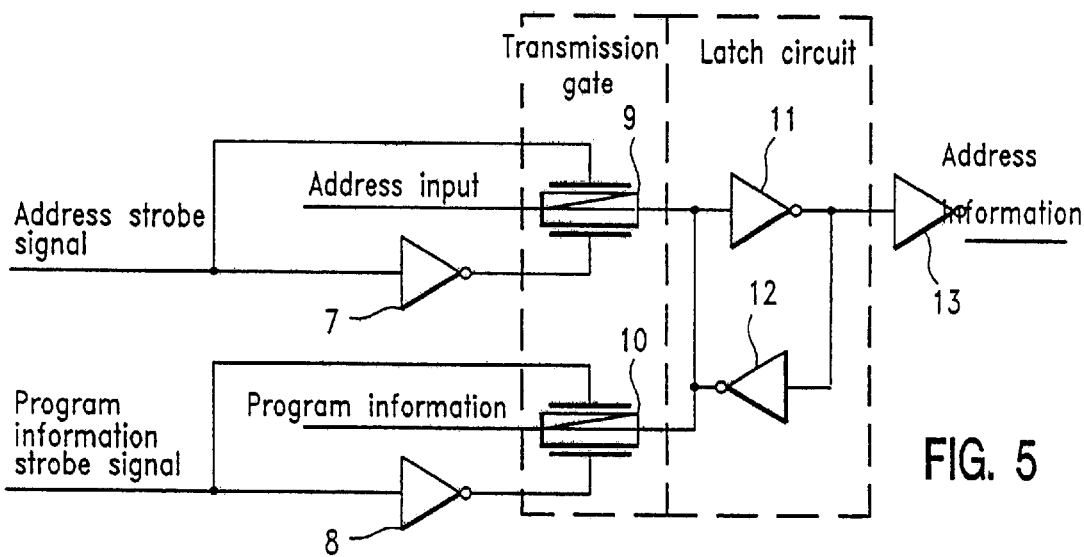
FIG. 5 is an illustration showing a configuration of the address-information renewing and holding Circuit 2' of the present invention.

FIG. 5 is an illustration showing a configuration of the address-information renewing and holding Circuit 2' of the present invention. The circuit is made-up of a latch circuit comprising inverters 7 and 8 for inputs, transmission gates 9 and 10, and inverters 11 and 12, and an inverter 13 for outputs. Because the Circuits 2' equal to the number of addresses, to 14 Circuits 2' may be required for one defect detection circuit. However, because the inverters 7 and 8 can be shared by one defect detection circuit block, a newly required circuit is an inverter 8 for each transmission gate 10 and each defect detection circuit block, compared to the case of the conventional Circuit 2.

In the case of operations of the circuit 2', when PR (Precharge Command) is set to LOW at the timing in FIG. 4, that is, when a precharge period starts, a program-information strobe signal is set to LOW and the transmission gate 10 is turned on in accordance with an output of the inverter 8. As a result, program information outputted from the circuit 1 is held by the latch circuits 11 and 12 and at the same time, outputted from the inverter 13 for outputs as address information. Moreover, when a row- or column-address strobe signal is set to LOW at the timing in FIG. 4, the transmission gate 9 is turned on in accordance with an output of the inverter 7. As a result, address inputs are held by the latch circuits 11 and 12 and at the same time, outputted from the inverter 13 for outputs as address information.

Figure 6:
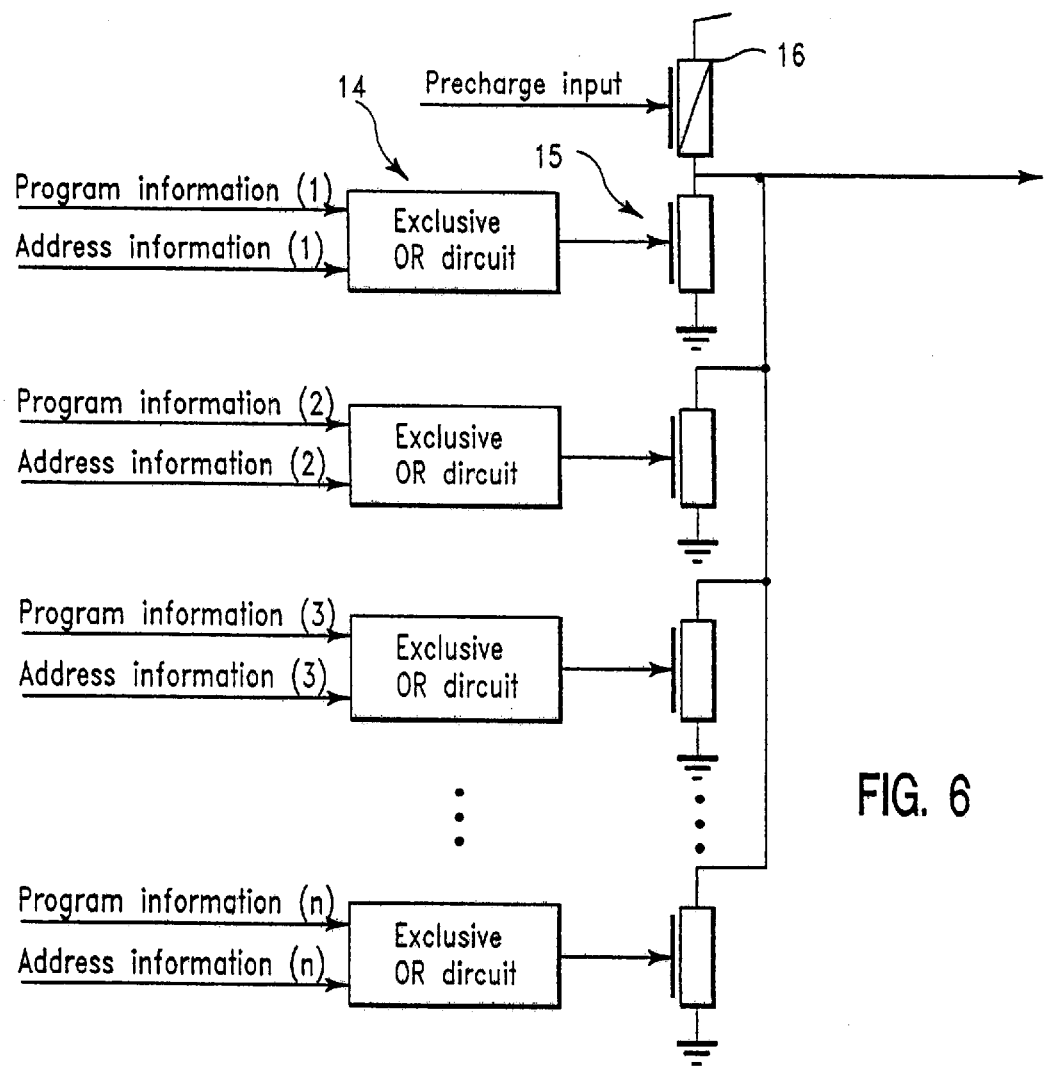
FIG. 6 is an illustration showing a configuration of the compare and detection Circuit 3' of the present invention.

FIG. 6 is an illustration showing a configuration of the compare and detection Circuit 3' of the present invention. The circuits in FIG. 6 are configured by a dynamic OR circuit 15 comprising a group 14 of exclusive OR circuits and a group of N-type FETs and a switch 16 comprising a P-type FET for precharge. In the case of operations of the circuit 3', when PR (Precharge Command) is set to LOW at the timing in FIG. 4, that is, when a precharge period starts, program information supplied from the Circuit 1' is inputted to the exclusive OR circuit 14 from the address-information refreshing and detection Circuit 2' as address information in accordance with operations of the Circuit 2' described above. Moreover, program information is directly inputted to the exclusive OR circuit 14 from the Circuit 1' as shown in FIG. 3. Therefore, the program information from the Circuit 1' and the address information from the Circuit 2' are inputted to the exclusive OR circuit 14 as the same information. The exclusive OR circuit 14 outputs LOW because inputs are the same. As a result, a switch 15 comprising all N-type FETs keeps an OFF state. In this case, a precharge input signal is set to LOW at the timing in FIG. 4 a LOW signal is inputted to the switch 16 comprising a P-type FET for precharge. As a result, the output is set to HIGH.

Then, when read/write operation starts, an address inputted from an external unit is outputted as new address information from the circuit 2' in accordance with operations of the circuit 2'. The new address information outputted from the circuit 2' is inputted to the exclusive OR circuit group 14 and compared with the program information from the circuit 1'. When address information is mismatched with program information in any one of the exclusive OR circuits in the exclusive OR circuit group 14, an output of the exclusive OR circuit is set to HIGH. As a result, the FET 16 corresponding to the exclusive OR circuit is turned on to update a detection output as LOW.

The compare and detection Circuit 3' of the present invention in FIG. 6 is made-up of a one-stage dynamic OR circuit comprising the exclusive OR circuit 14 and an N-type FET. In this connection, the configuration is a new configuration obtained by:

(1) effectively using a precharge period, and (2) making the address-information renewing and holding circuit 2' previously hold outputs (program information) of the program-information holding circuit 1 at the end of the last operation as address information before refreshing and holding addresses in the address-information refreshing and holding circuit 2'.

Therefore, the compare and detection Circuit 3' in FIG. 6 can more quickly operate because the circuit 3 has a small number of logical gates compared to a comparing and detecting circuit requiring logical gates of at least three stages as the conventional combinational circuit 5 in FIG. 2. Moreover, because the transmission gate 10 newly required for the address-information renewing and holding circuit 2' of the present invention in FIG. 5 can be constituted of a CMOS transmission gate and a holding circuit (latch circuit) can be shared by existing circuits, a circuit area to be increased is so small that it can be ignored.

While the invention has been particularly shown and described with respect to illustrative and performed embodiments thereof, it will be understood by those skilled in the art that the foregoing and other changes in form and details may be made therein without departing from the spirit and scope of the invention which should be limited only by the scope of the appended claims.

What is claimed is:

1. A circuit for detecting defects in a semiconductor memory having spare row lines and column lines, comprising:
    a program-information holding circuit for holding program information showing addresses previously assigned to spare row lines or column lines;
    an address-information renewing and holding circuit for refreshing and holding address information for row lines and column lines to be accessed in read or write operation; and
    a compare and detection circuit for comparing program information outputted from the program-information holding circuit with address information outputted from the address-information renewing and holding circuit and detecting whether to replace a row line or column line to be accessed with a spare row line or column line; wherein
    the address-information renewing and holding circuit has a function of previously holding program information outputted from the program-information holding circuit at the end of the last operation as address information.

2. The circuit for detection of defects in a semiconductor memory according to claim 1, wherein the address-information renewing and holding circuit holds program information outputted from the program-information holding circuit in accordance with a precharge signal and outputs the program information as address information.

3. A circuit for detection of defects in a semiconductor memory having spare row lines and column lines, comprising:
    a program-information holding circuit for holding program information showing addresses previously assigned to spare row lines or column lines;
    an address-information renewing and holding circuit for refreshing and holding address information of row lines and column lines to be accessed in read or write operation, which holds address information inputted in accordance with an address strobe signal, holds program information supplied from the program information holding circuit in accordance with a program-information strobe signal, and selectively outputs these two pieces of information as address information; and
    a compare and detection circuit for comparing program information outputted from the program-information holding circuit with address information outputted from the address-information renewing and holding circuit and judging whether to replace a row line or column line to be accessed with a spare row line or column line, which has an exclusive OR circuit for receiving program information and address information and a dynamic OR circuit for receiving outputs of the exclusive OR circuit.

4. A method for detecting defects in a semiconductor memory having spare row lines and column lines, comprising the steps of:
    holding program information showing addresses previously assigned to spare row lines or column lines;
    holding address information of row lines and column lines to be accessed input from an external unit in read or write operation; and
    comparing the held program information with the held address information and judging whether to replace a row line or column line to be accessed with a spare row line or column line; wherein
    the address-information holding step includes the step of previously holding the program information held at the end of the last operation as address information.

5. The method for detecting defects in a semiconductor memory according to claim 4, wherein the address-information holding step includes;
    the step of holding and outputting address information inputted in accordance with an address strobe signal, and
    the step of previously holding and outputting program information inputted as address information in accordance with a program-information strobe signal.

* * * * *